US010685734B2

(12) United States Patent
Mochizuki

(10) Patent No.: US 10,685,734 B2
(45) Date of Patent: Jun. 16, 2020

(54) SEMICONDUCTOR INTEGRATED CIRCUIT AND TEST METHOD

(71) Applicant: TOSHIBA MEMORY CORPORATION, Minato-ku (JP)

(72) Inventor: Yoshio Mochizuki, Fujisawa (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/294,976

(22) Filed: Mar. 7, 2019

(65) Prior Publication Data

US 2019/0378588 A1 Dec. 12, 2019

(30) Foreign Application Priority Data

Jun. 12, 2018 (JP) .................................. 2018-112025

(51) Int. Cl.
| | | |
|---|---|---|
| *G11C 16/00* | (2006.01) | |
| *G11C 29/50* | (2006.01) | |
| *G11C 16/30* | (2006.01) | |
| *G11C 16/26* | (2006.01) | |
| *G11C 16/10* | (2006.01) | |
| G11C 16/04 | (2006.01) | |

(52) U.S. Cl.
CPC ........ *G11C 29/50004* (2013.01); *G11C 16/10* (2013.01); *G11C 16/26* (2013.01); *G11C 16/30* (2013.01); *G11C 16/0483* (2013.01); *G11C 2029/5004* (2013.01)

(58) Field of Classification Search
CPC ...... G11C 29/50004; G11C 2029/5004; G11C 16/10; G11C 16/26; G11C 16/30; G11C 16/0483
See application file for complete search history.

(56) References Cited

U.S. PATENT DOCUMENTS

| | | | |
|---|---|---|---|
| 2002/0180543 A1 | 12/2002 | Song et al. | |
| 2003/0006822 A1* | 1/2003 | Murakami | ............. G01K 15/00 327/513 |
| 2007/0126471 A1 | 6/2007 | Jeong | |
| 2008/0061760 A1 | 3/2008 | Jeong | |
| 2008/0082290 A1 | 4/2008 | Jeong et al. | |

(Continued)

FOREIGN PATENT DOCUMENTS

| | | |
|---|---|---|
| JP | 2003-005861 | 1/2003 |
| JP | 2007-327932 | 12/2007 |

(Continued)

*Primary Examiner* — Christine T. Tu
(74) *Attorney, Agent, or Firm* — Oblon, McClelland, Maier & Neustadt, L.L.P.

(57) ABSTRACT

A semiconductor integrated circuit according to an embodiment includes: a first circuit, an analog-to-digital converter, an external input terminal, a selector, and a second circuit. The first circuit is configured to generate a first voltage corresponding to a temperature. The analog-to-digital converter is configured to convert the first voltage into a first digital value. The external input terminal is a terminal to which a second digital value is input from outside. The selector is configured to select either the first digital value or the second digital value. The second circuit is configured to generate a second voltage based on a third digital value being a digital value selected by the selector.

10 Claims, 10 Drawing Sheets

(56) References Cited

U.S. PATENT DOCUMENTS

| | | | |
|---|---|---|---|
| 2012/0256772 A1* | 10/2012 | Wani | G11C 16/30 |
| | | | 341/110 |
| 2017/0023966 A1* | 1/2017 | Kim | G05F 3/245 |
| 2017/0117903 A1* | 4/2017 | Fukuzawa | H03B 5/32 |

FOREIGN PATENT DOCUMENTS

| | | |
|---|---|---|
| JP | 2008-071335 | 3/2008 |
| JP | 2008-084514 | 4/2008 |

* cited by examiner

US 10,685,734 B2

SEMICONDUCTOR INTEGRATED CIRCUIT AND TEST METHOD

CROSS-REFERENCE TO RELATED APPLICATIONS

This application is based upon and claims the benefit of priority from Japanese Patent Application No. 2018-112025, filed Jun. 12, 2018, the entire contents of which are incorporated herein by reference.

FIELD

Embodiments described herein relate generally to a semiconductor integrated circuit and a test method.

BACKGROUND

There is known a semiconductor integrated circuit that includes a correction circuit correcting various internal voltages depending on temperature. In a development stage of the semiconductor integrated circuit, the semiconductor integrated circuit is tested by using the correction circuit to determine whether it operates appropriately.

DETAILED DESCRIPTION

According to the present embodiment, a semiconductor integrated circuit includes a first circuit, an analog-to-digital converter, an external input terminal, a selector, and a second circuit. The first circuit is configured to generate a first voltage corresponding to a temperature. The analog-to-digital converter is configured to convert the first voltage into a first digital value. The external input terminal is a terminal to which a second digital value is input from outside. The selector is configured to select either the first digital value or the second digital value. The second circuit is configured to generate a second voltage based on a third digital value being a digital value selected by the selector.

Exemplary embodiments of a semiconductor integrated circuit and a test method will be explained below in detail with reference to the accompanying drawings. The present invention is not limited to the following embodiments.

Embodiments

Hereinafter, a case where the technique of the semiconductor integrated circuit of an embodiment is applied to a NAND type flash memory (hereinafter referred to as a NAND memory) will be described.

Figure 1:
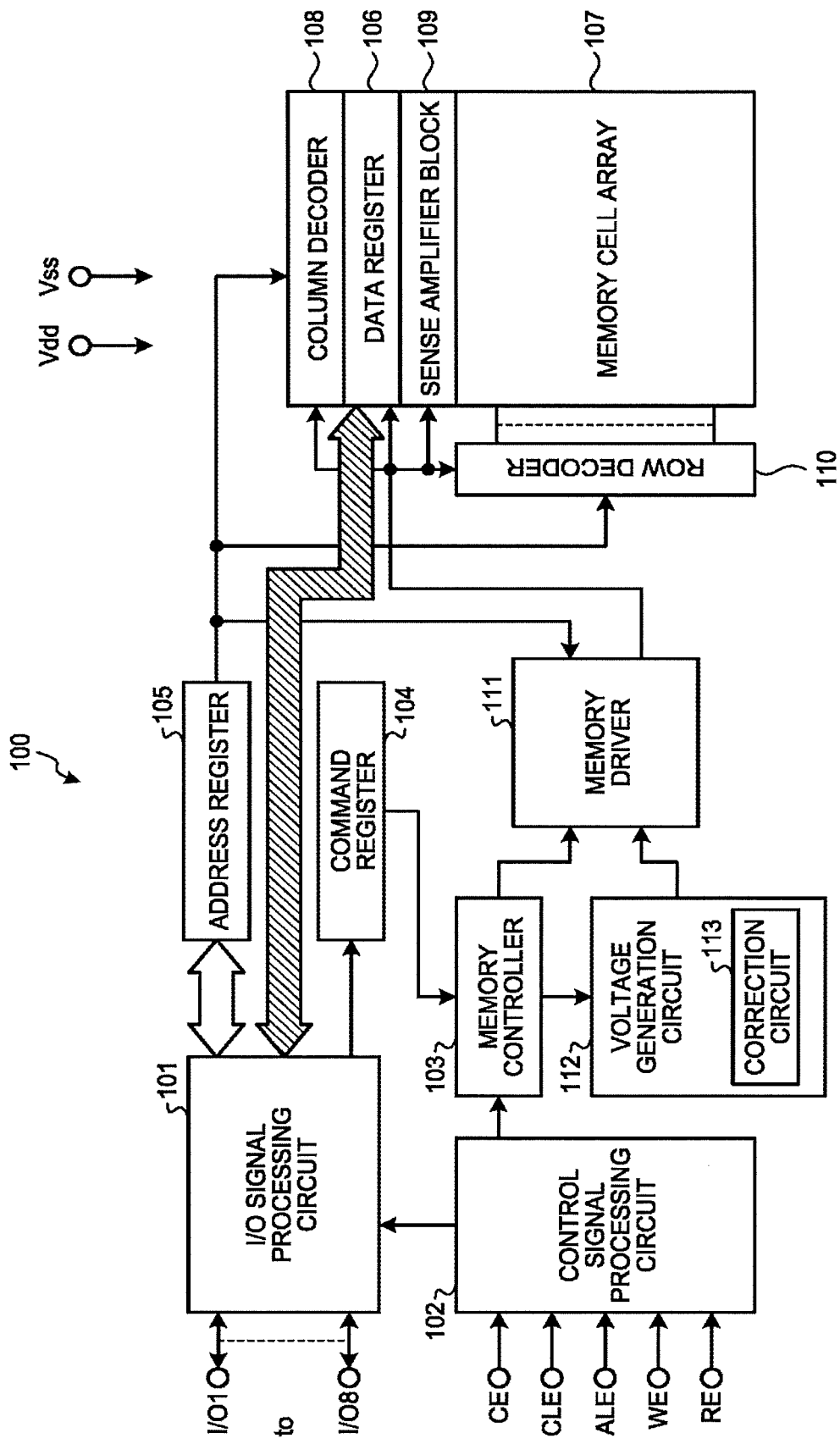
FIG. 1 is a diagram illustrating a configuration of a NAND memory according to an embodiment.

FIG. 1 is a diagram illustrating a configuration of a NAND memory according to the embodiment. The NAND memory 100 includes an input/output (I/O) signal processing circuit 101, a control signal processing circuit 102, a memory controller 103, a command register 104, an address register 105, a data register 106, a memory cell array 107, a column decoder 108, a sense amplifier block 109, a row decoder 110, a memory driver 111, and a voltage generation circuit 112.

Figure 2:
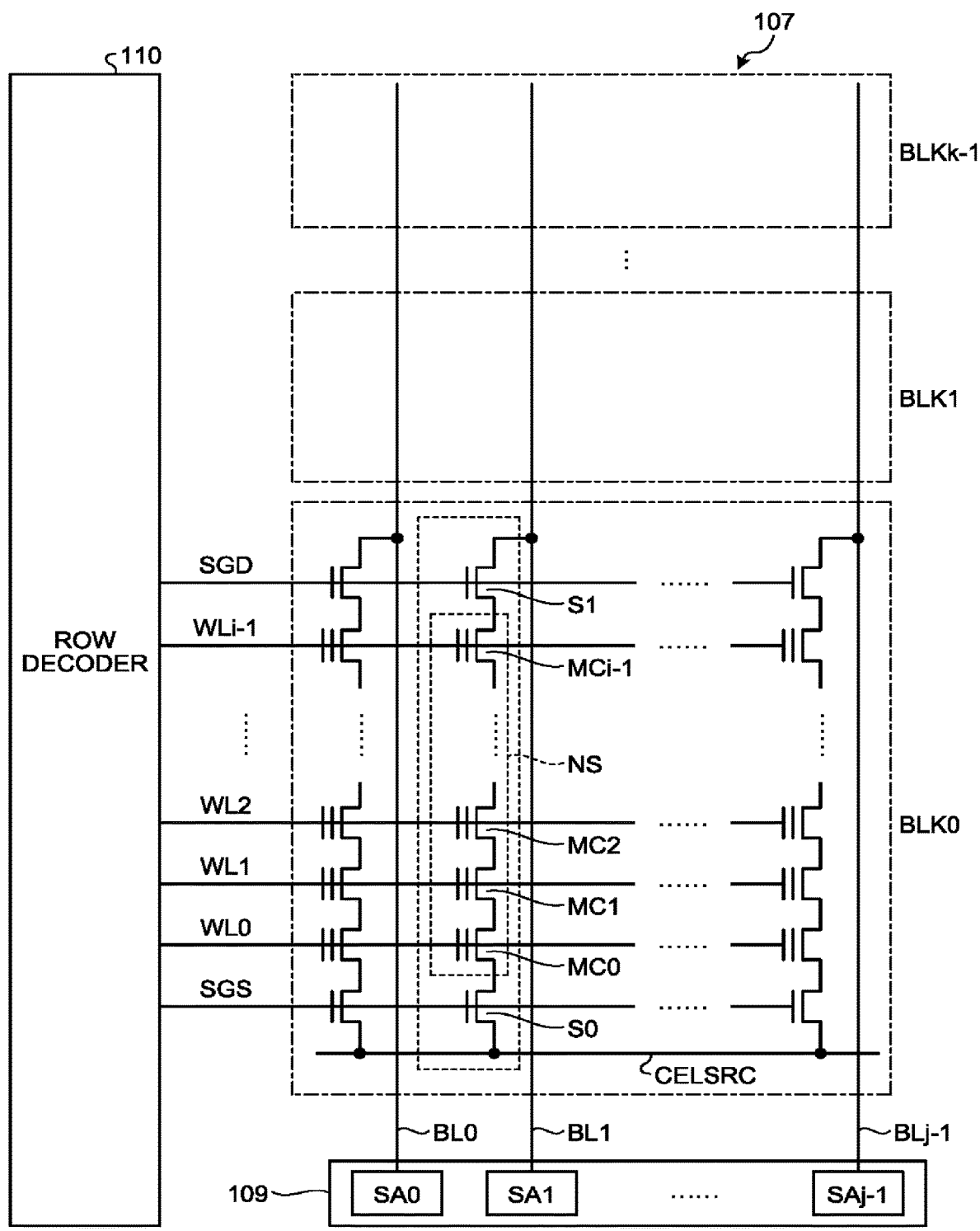
FIG. 2 is a diagram illustrating a configuration of a memory cell array according to the embodiment.

FIG. 2 is a diagram illustrating a configuration of the memory cell array 107 according to the embodiment. According to FIG. 2, the memory cell array 107 includes k blocks BLK (BLK0 to BLKk−1). All pieces of data retained in one block BLK are erased all at once. Since the k blocks BLK have similar configurations, the configuration of BLK0 will be described here as a representative.

In BLK0, a memory cell unit is constituted by a NAND string NS made up of i pieces of serially connected memory cells (memory cell transistors) MC0 to MCi−1 and select gate transistors S0 and S1 connected to two ends of the NAND string NS. A source of the select gate transistor S0 is connected to a common source line CELSRC and a drain of the select gate transistor S1 is connected to one of bit lines BL (BL0 to BLj−1).

The sense amplifier block 109 includes j sense amplifier circuits (SA: SA0 to SAj−1) corresponding to the j bit lines BL0 to BLj−1.

Gates of the select gate transistors S0 and S1 are connected to select gate lines SGS and SGD. The select gate lines SGS and SGD are used for selecting the bit lines.

Control gates of the memory cells MC0 to MCi−1 are connected to word lines WL (WL0 to WLi−1), respectively. In other words, control gate electrodes of the memory cells MC located in the same row in the block are connected to the same word line WL. When each memory cell MC is configured to hold a 1-bit value, j memory cells MC connected to the same word line WL are handled as one page and program processing and readout processing are performed per the page.

Note that each memory cell MC may be configured to hold a value of a plurality of bits. When each memory cell MC is configured to hold a value of a plurality of bits, j memory cells MC connected to the same word line WL are handled as a plurality of pages.

Furthermore, in the above description, an example in which the memory cells MC are two-dimensionally arranged has been explained. The memory cell array 107 may have a configuration in which the memory cells MC are three-dimensionally arranged. In that case, for example, a stacked body, in which a conductive film and an insulating film are alternately stacked, is penetrated by a columnar semiconductor pillar, and the memory cell MC is provided at a portion where the conductive film and the semiconductor pillar intersect. In other words, the NAND string NS is provided perpendicular to a substrate. The sense amplifier circuit SA is connected to one end of the NAND string NS.

Description will be given returning to FIG. 1. The NAND memory 100 is connected to a controller provided outside the NAND memory 100 through a predetermined communication path. The communication path is constituted by a wire group including an I/O signal line and a control signal line. The I/O signal line is, for example, a signal line for transmitting and receiving data, an address, or a command. The command includes a program command instructing program processing, a readout command instructing readout processing, and an erase command instructing erase processing. The control signal line is a signal line for transmitting and receiving, for example, a chip enable (CE) signal, read enable (RE) signal, a write enable (WE) signal, an address latch enable (ALE) signal, and command latch enable (CLE).

The I/O signal processing circuit 101 is a buffer circuit for transmitting and receiving an I/O signal to and from the externally provided controller. The I/O signal processing circuit 101 can capture commands, addresses, and data via the I/O signal lines. The I/O signal processing circuit 101 retains the commands in the command register 104, retains the addresses in the address register 105, and retains the data in the data register 106.

The control signal processing circuit 102 accepts inputs of various control signals and, on the basis of the accepted control signals, allocates the I/O signals accepted by the I/O signal processing circuit 101 to the registers as retention destinations.

The address retained in the address register 105 includes a row address and a column address. The row address is read out to the row decoder 110 and the column address is read out to the column decoder 108.

The memory driver 111 is a circuit that supplies various voltages necessary for access to the memory cell array 107 (the readout processing, the program processing, and the erase processing) to the row decoder 110, the column decoder 108, and the sense amplifier block 109.

The voltage generation circuit 112 is supplied with a ground voltage Vss and a power supply voltage Vdd from the outside. The voltage generation circuit 112 generates various internal voltages on the basis of these voltages and commands from the memory controller 103 and supplies the generated various internal voltages to the memory driver 111.

The memory controller 103 is a circuit whose state transitions on the basis of the various control signals received via the control signal processing circuit 102 and controls the entire operation of the NAND memory 100. For example, the memory controller 103 issues commands to the memory driver 111, the row decoder 110, the column decoder 108, the sense amplifier block 109, and the voltage generation circuit 112 to control the various internal voltages, operation timing, and the like, thereby implementing access to the memory cell array 107.

For example, in the program processing, the row decoder 110 selects the word line WL on the basis of the row address. The column decoder 108 selects the bit line BL on the basis of the column address. A programming pulse is applied, via the row decoder 110, to a memory cell MC (referred to as memory cell MCsel) positioned at the intersection between the word line WL selected by the row decoder 110 (referred to as word line WLsel) and the bit line BL selected by the column decoder 108 (referred to as bit line BLsel). By the application of the programming pulse, a threshold voltage of the memory cell MCsel is set to have a state corresponding to the data retained in the data register 106.

For example, when each memory cell MC is configured to hold a 1-bit value, the threshold voltage is set to have either state. A value "0" is associated with one of the two states, whereas a value "1" is associated with the other state.

When each memory cell MC is configured to hold an n-bit value, the threshold voltage is set to have one of $2^n$ states. Mutually different n-bit values are associated with each of the $2^n$ states.

In the readout processing, as in the program processing, the word line WLsel and the bit line BLsel are selected on the basis of the row address and the column address. The sense amplifier block 109 and the row decoder 110 cooperatively determine the state of the threshold voltage of the memory cell MCsel positioned at the intersection between the word line WLsel and the bit line BLsel, and retain data corresponding to the determined state in the data register 106. The data retained in the data register 106 is sent to the I/O signal processing circuit 101 through a data line, and is transferred to the external controller from the I/O signal processing circuit 101.

The state of the threshold voltage is determined by, for example, applying a determination voltage corresponding to the boundary between the states to the control gate of the memory cell MCsel and observing the behavior of the memory cell MCsel. Hereinafter, the determination voltage is sometimes referred to as VCGRV.

Figure 3:
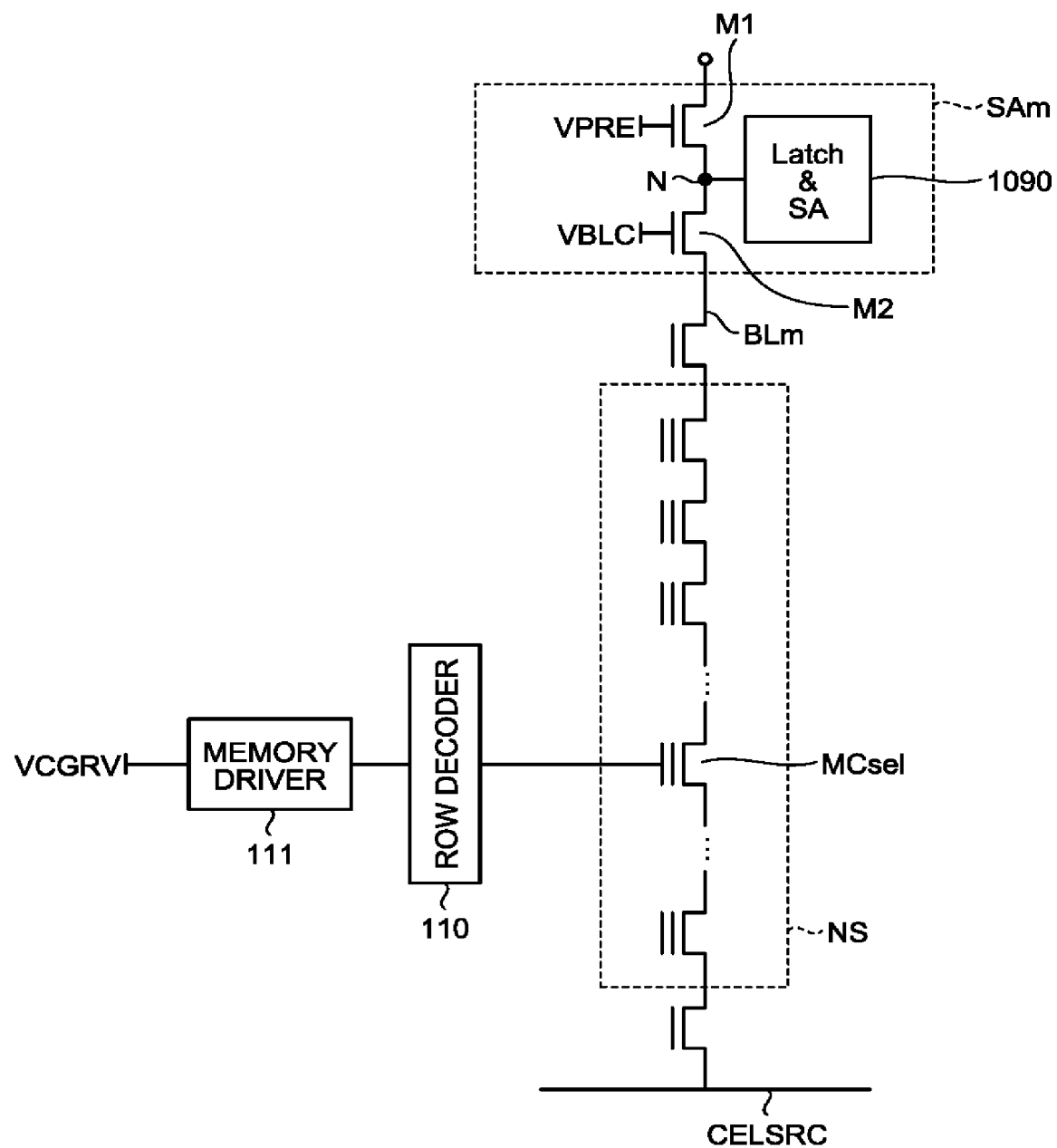
FIG. 3 is a diagram for explaining an example of the configuration of the embodiment for determining the state of a threshold voltage.

FIG. 3 is a diagram for explaining an example of the configuration of the embodiment for determining the state of the threshold voltage. As an example, description will be given here of a configuration for determining, for the memory cell MCsel connected to the bit line BLm (m is an integer from 0 to j−1), whether the threshold voltage is set to have a state higher than the determination voltage VCGRV or the threshold voltage is set to have a state lower than the determination voltage VCGRV.

The sense amplifier circuit SAm includes transistors M1 and M2 and a latch & sense amplifier 1090. In the transistor M2, either the source or the drain is connected to the bit line BLm and the other is connected to a node N. In the transistor M1, either the source or the drain is connected to the node N and the other is connected to the power supply potential Vdd. The latch & sense amplifier 1090 is connected to the node N.

When the state of the threshold voltage of the memory cell MCsel is determined, the sense amplifier circuit SAm applies a voltage VBLC to the gate of the transistor M2 and a voltage VPRE to the gate of the transistor M1. Here, VPRE≥VBLC is satisfied. The voltage of the bit line BLm is clamped to a predetermined voltage (precharge voltage) by the transistor M2 and the bit line BLm is placed in a precharged state.

The row decoder 110 applies a voltage VREAD to the gates of all the memory cells MC connected to the bit line BLm except the memory cell MCsel so as to turn on each memory cell MC irrespective of the threshold voltage (not illustrated). The row decoder 110 applies the determination voltage VCGRV to the gate of the memory cell MCsel.

Then, when the threshold voltage of the memory cell MCsel is lower than the determination voltage VCGRV and the memory cell MCsel is being turned on, a cell current flows in the node N. On the other hand, when the threshold voltage of the memory cell MCsel is higher than the determination voltage VCGRV and the memory cell MCsel is being turned off, the cell current does not flow in the node N. The latch & sense amplifier 1090 detects whether the cell current has flowed, thereby being able to specify whether the threshold voltage of the memory cell MCsel is in a state higher than the determination voltage VCGRV or in a state lower than the determination voltage VCGRV.

Accordingly, the state of the threshold voltage of the memory cell MC is determined by comparison with the determination voltage VCGRV. When each memory cell MC is configured to hold a value of a plurality of bits, the determination voltage VCGRV is prepared for each state boundary.

Meanwhile, the threshold voltage of the memory cell MC may fluctuate depending on the temperature. Therefore, when assuming that the determination voltage VCGRV or the voltage VBLC is fixed, there is a possibility of erroneously determining the state of the threshold voltage. In order to suppress erroneous determination of the state of the threshold voltage, a correction circuit 113 that corrects the determination voltage VCGRV and the voltage VBLC according to the temperature is provided. In FIG. 1, as an example, the correction circuit 113 is provided within the voltage generation circuit 112.

Figure 4:
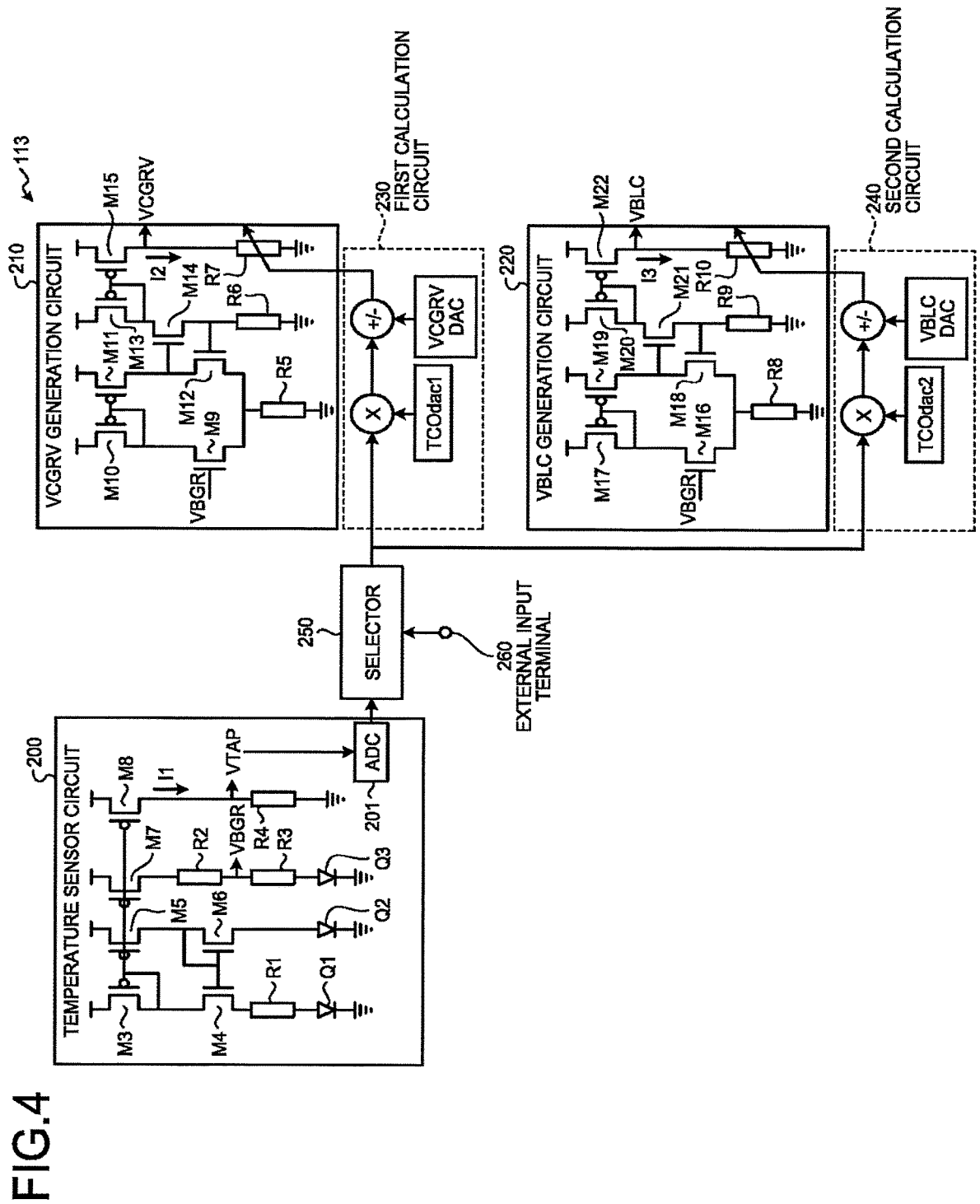
FIG. 4 is a diagram illustrating an example of the configuration of a correction circuit according to the embodiment.

FIG. 4 is a diagram illustrating an example of the configuration of the correction circuit 113 according to the embodiment. As illustrated in FIG. 4, the correction circuit 113 includes a temperature sensor circuit 200, a VCGRV generation circuit 210, a VBLC generation circuit 220, a first calculation circuit 230, a second calculation circuit 240, a selector 250, and an external input terminal 260.

The temperature sensor circuit 200 includes six transistors M3 to M8, four resistors R1 to R4, three diodes Q1 to Q3, and an analog-to-digital converter (ADC) 201. The transistors M3 to M5, the resistors R1 to R3, and the diodes Q1 to Q3 constitute a band gap type voltage source circuit and generate a constant voltage VBGR independent of temperature.

A current I1 proportional to the temperature flows in the transistor M8 by a current mirror. The temperature sensor circuit 200 generates a voltage VTAP proportional to the temperature by the current I1 and the resistor R4.

Figure 5:
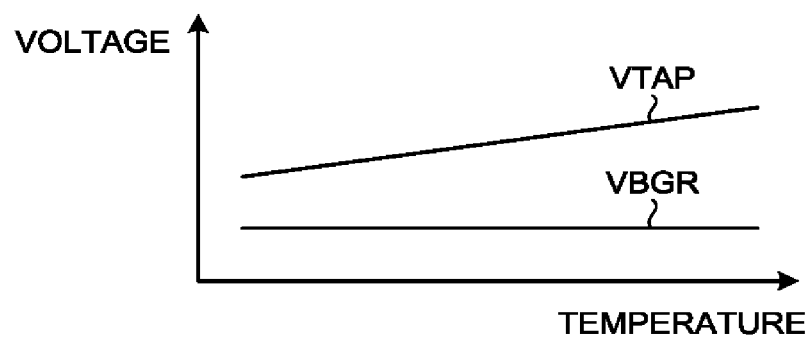
FIG. 5 is a diagram for explaining an example of the temperature characteristics of a voltage VTAP and a voltage VBGR generated by a temperature sensor circuit according to the embodiment.

FIG. 5 is a diagram for explaining an example of the temperature characteristics of the voltage VTAP and the voltage VBGR generated by the temperature sensor circuit 200 according to the embodiment. As exemplified in FIG. 5, the voltage VBGR takes a constant value independent of temperature. On the other hand, the voltage VTAP has a characteristic of linearly increasing in accordance with an increase in temperature.

Description will be given returning to FIG. 4. The voltage VTAP is converted into a digital value TEMPCODE by the ADC 201.

The digital value TEMPCODE is input to the first calculation circuit 230 and the second calculation circuit 240 via the selector 250. The selector 250 will be described later.

The first calculation circuit 230 carries out digital calculations on the digital value TEMPCODE, such as multiplication of TCO_DAC1 and addition and subtraction of VCGRV_DAC. The first calculation circuit 230 manipulates the resistance value of a variable resistor R7 included in the VCGRV generation circuit 210 according to a digital value obtained by these digital calculations.

The VCGRV generation circuit 210 is an analog circuit including seven transistors M9 to M15, two resistors R5 and R6, and the variable resistor R7. The voltage VBGR is input to the gate of the transistor M9 and a constant current I2 according to the voltage VBGR flows in the transistor M15 and the variable resistor R7. Then, the VCGRV generation circuit 210 generates the voltage VCGRV according to the resistance value of the variable resistor R7 and the current I2.

Figure 6:
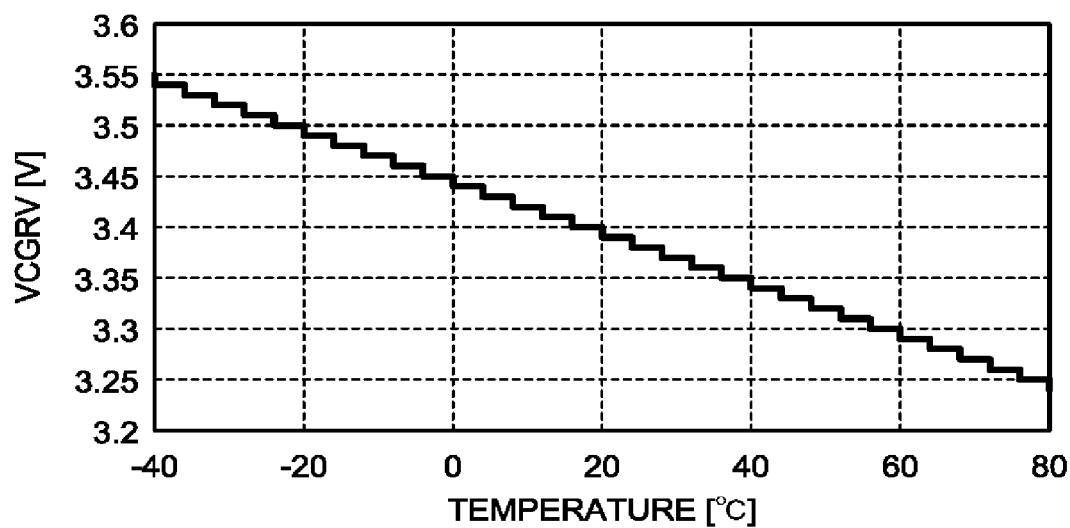
FIG. 6 is a diagram for explaining an example of the temperature characteristics of a voltage VCGRV generated by a VCGRV generation circuit according to the embodiment.

Since the resistance value of the variable resistor R7 is controlled by the digital value having temperature dependency, the voltage VCGRV generated by the VCGRV generation circuit 210 has temperature dependency. FIG. 6 is a diagram for explaining an example of the temperature characteristics of the voltage VCGRV generated by the VCGRV generation circuit 210 according to the embodiment.

In the example in FIG. 6, the voltage VCGRV decreases as the temperature rises. In addition, the resistance value of the variable resistor R7 that defines the voltage VCGRV is set by the calculation result of the first calculation circuit 230, that is, the digital value. Therefore, the value of the voltage VCGRV changes stepwise with the granularity according to the number of bits of the calculation result of the first calculation circuit 230. In this example, the value of the voltage VCGRV changes at increments of 10 mV.

Description will be given returning to FIG. 4. The second calculation circuit 240 carries out digital calculations on the digital value TEMPCODE, such as multiplication of TCO_DAC2 and addition and subtraction of VBLC_DAC. The second calculation circuit 240 manipulates the resistance value of a variable resistor R10 included in the VBLC generation circuit 220 according to a digital value obtained by these digital calculations.

The VBLC generation circuit 220 is an analog circuit including seven transistors M16 to M22, two resistors R8 and R9, and the variable resistor R10. The voltage VBGR is input to the gate of the transistor M16 and a constant current I3 according to the voltage VBGR flows in the transistor M22 and the variable resistor R10. The VBLC generation circuit 220 generates the voltage VBLC according to the resistance value of the variable resistor R10 and the current I3.

Figure 7:
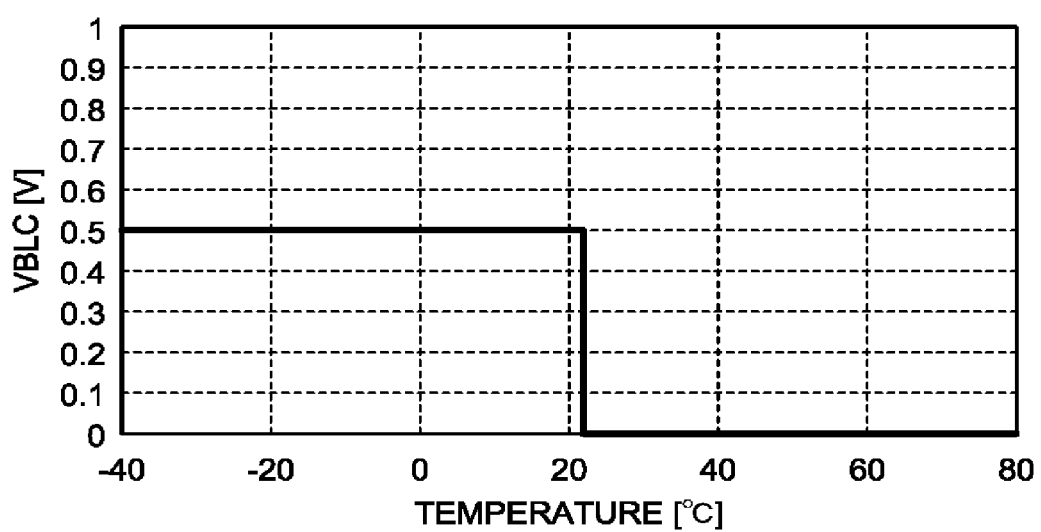
FIG. 7 is a diagram for explaining an example of the temperature characteristics of a voltage VBLC generated by a VBLC generation circuit according to the embodiment.

Since the resistance value of the variable resistor R10 is controlled by the digital value having temperature dependency, the voltage VBLC generated by the VBLC generation circuit 220 has temperature dependency. FIG. 7 is a diagram for explaining an example of the temperature characteristics of the voltage VBLC generated by the VBLC generation circuit 220 according to the embodiment.

In the example in FIG. 7, the voltage VBLC decreases as the temperature rises. The voltage VBLC changes stepwise with the granularity according to the number of bits of the calculation result of the second calculation circuit 240. In FIG. 7, the value of the voltage VBLC changes at increments of 500 mV.

As described above, in the correction circuit 113, the temperature sensor circuit 200 generates the voltage VTAP corresponding to the temperature. Then, the ADC 201 converts the voltage VTAP into the digital value TEMPCODE. The first calculation circuit 230 and the second calculation circuit 240 perform digital calculations different from each other on the digital value TEMPCODE. The VCGRV generation circuit 210 and the VBLC generation circuit 220 generate the voltage VCGRV and the voltage VBLC according to the digital values obtained by the respective digital calculations.

In the stage of development of the NAND memory, in order to find out whether the correction circuit functions properly, for example, a test of accessing the memory cell array while changing the temperature of the NAND memory stepwise is carried out. In that case, it takes time to stabilize the value of TEMPCODE at each temperature value. Thus, the total time required for the test becomes enormous.

In the embodiment, in order to shorten the total time required for the test, the selector 250 is provided on an output side of the ADC 201 such that the output of the selector 250 can be switched between the TEMPCODE and an input from the external input terminal 260. With this structure in the test, a value simulating the digital value TEMPCODE (hereinafter referred to as TEMPCODE'), which is generated by varying the temperature of the NAND memory 100, is supplied to the first calculation circuit 230 and the second calculation circuit 240. Therefore, the voltage VCGRV and the voltage VBLC corresponding to the digital value TEMPCODE can be generated without actually varying the temperature of the NAND memory 100.

Hereinafter, a test method for the NAND memory 100 according to the embodiment will be described. The test of the NAND memory 100 is executed using a test apparatus.

Figure 8:
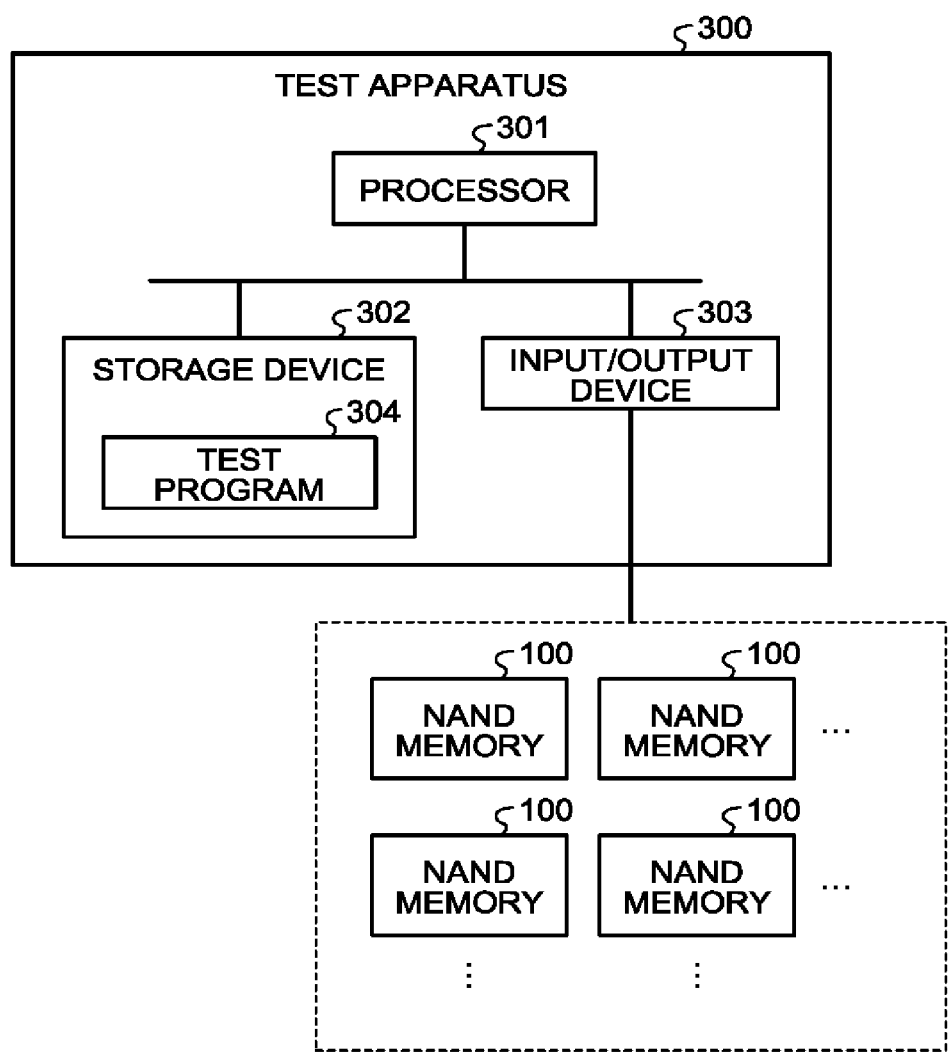
FIG. 8 is a diagram illustrating a configuration of a test apparatus that tests the NAND memory according to the embodiment.

FIG. 8 is a diagram illustrating a configuration of a test apparatus that tests the NAND memory 100 according to the embodiment. The test apparatus 300 includes a processor 301, a storage device 302, and an input/output device 303.

The input/output device 303 is an interface device connected to the NAND memory 100. The input/output device 303 is connected to, for example, the I/O signal line and the control signal line included in the NAND memory 100. In addition, the input/output device 303 is particularly connected to the selector 250 and the external input terminal 260 and is capable of switching the selector 250 and inputting the digital value to the external input terminal 260.

Note that, as exemplified in FIG. 8, a plurality of NAND memories 100 may be connected to the input/output device 303.

The storage device 302 includes a nonvolatile storage medium such as a read only memory (ROM), a flash memory, a hard disk drive (HDD), and an SD card, and a volatile storage medium such as a random access memory (RAM) and a register. Additionally, a test program 304 executed by the processor 301 is retained in the storage device 302 in advance.

The processor 301 is, for example, a central processing unit (CPU). The processor 301 can carry out a test method according to the embodiment by executing the test program 304 retained in the storage device 302.

Figure 9:
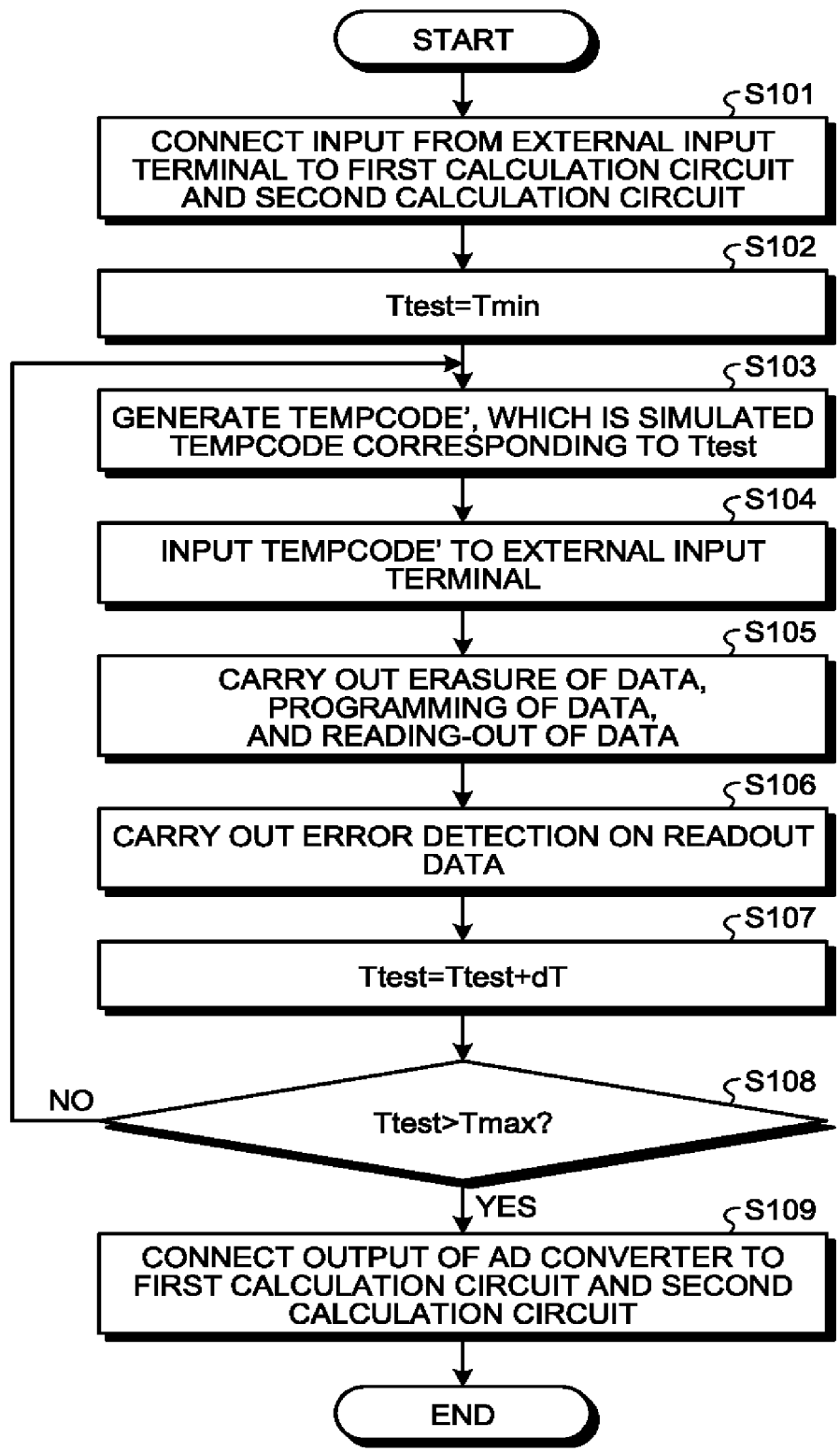
FIG. 9 is a flowchart illustrating an example of a test method for the NAND memory carried out using the test apparatus according to the embodiment.

FIG. 9 is a flowchart illustrating an example of the test method according to the embodiment. Note that this example will describe a method for obtaining a result equivalent to the case of performing the test while changing the temperature from a minimum value Tmin to a maximum value Tmax.

The test apparatus 300 manipulates the selector 250 to connect an input from the external input terminal 260 to the first calculation circuit 230 and the second calculation circuit 240 (S101).

Then, the test apparatus 300 sets Tmin as a simulated test temperature Ttest (S102) and generates TEMPCODE', which is a simulated TEMPCODE corresponding to Ttest (S103).

For example, the test apparatus 300 acquires data indicating the correspondence between the temperature and TEMPCODE in advance by measurement, computation, or the like, and works out TEMPCODE' on the basis of the acquired data. In another example, the test apparatus 300 calculates TEMPCODE' each time. The test apparatus 300 can generate TEMPCODE' by an arbitrary method.

The test apparatus 300 inputs generated TEMPCODE' to the external input terminal 260 (S104).

The test apparatus 300 carries out erasure of data, writing of data, and reading-out of data in the NAND memory 100 in this order (S105). For example, the test apparatus 300 can carry out these items of processing by controlling the I/O signal line and the control signal line.

Next, the test apparatus 300 carries out error detection on the readout data (S106). The test apparatus 300 aggregates the number of detected error bits (fail bit count: FBC) for each storage area of a predetermined size (for example, for each page) and retains the aggregated number of detected error bits in the storage device 302 in association with Ttest.

The test apparatus 300 increases Ttest by a predetermined increment width dT (for example, one degree) (S107) and determines whether Ttest exceeds Tmax (S108). When it is determined that Ttest has not exceeded Tmax (S108, No), control proceeds to S103.

When it is determined that Ttest has exceeded Tmax (S108, Yes), the test apparatus 300 manipulates the selector 250 to connect the output of the ADC 201 to the first calculation circuit 230 and the second calculation circuit 240 (S109). The test according to the embodiment is completed.

A developer determines whether the correction circuit 113 is functioning properly on the basis of the FBC obtained for each Ttest.

Figure 10:
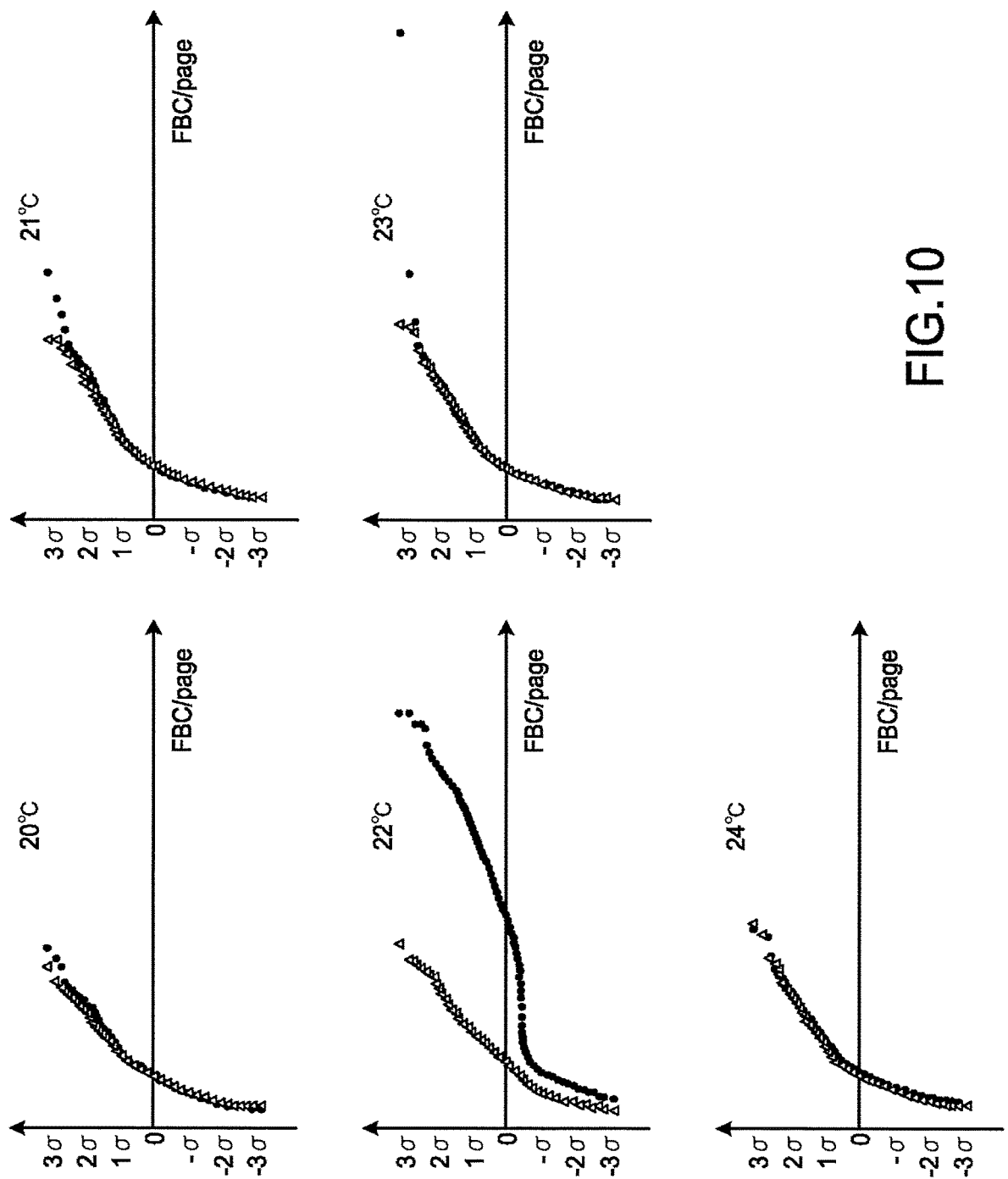
FIG. 10 is a diagram for explaining an example of a test result obtained by the test method according to the embodiment.

FIG. 10 is a diagram for explaining an example of the test result obtained by the test method according to the embodiment. FIG. 10 illustrates test results at each temperature when Ttest is changed from 20 degrees (Centigrade) to 24 degrees (Centigrade) by one degree. In each temperature graph, the vertical axis represents the variation and the horizontal axis represents the number of detected errors (FBC) for each page. In addition, a denotes the standard deviation.

Furthermore, in each graph, the round dots indicate a test result in a case where the correction circuit 113 is configured such that the voltage VBLC changes at increments of 500 mV.

According to the test result, when Ttest is given as 20 degrees (Centigrade), 21 degrees (Centigrade), 23 degrees (Centigrade), and 24 degrees (Centigrade), the distributions of the number of error occurrences are similar to each other. On the other hand, when Ttest is given as 22 degrees (Centigrade), it can be seen that the number of error occurrences grows remarkably large, as compared with the cases where Ttest is given as the other values.

Figure 11:
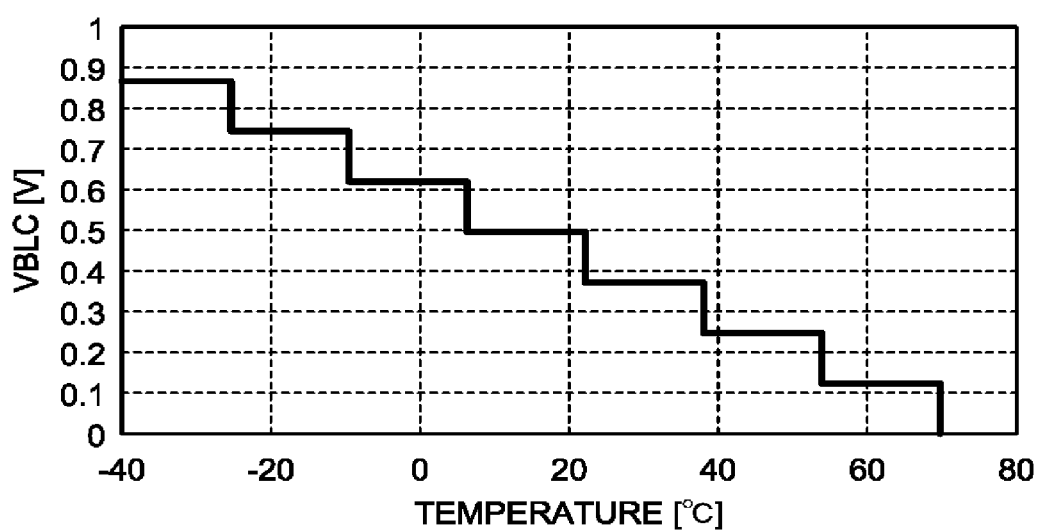
FIG. 11 is a diagram for explaining another example of the temperature characteristics of the voltage VBLC generated by the VBLC generation circuit according to the embodiment.

The rapid increase in the number of error occurrences when Ttest is given as 22 degrees (Centigrade) is due to a sharp fluctuation of the voltage VBLC at 22 degrees (Centigrade) (see FIG. 7). Thus, an improvement such as increasing the bit width of the second calculation circuit 240 was made on the correction circuit 113 and, as exemplified in FIG. 11, the voltage VBLC was allowed to change by an increment width of 12.5 mV. Then, the test exemplified in FIG. 10 was executed again.

The white triangle dots in FIG. 10 indicate the result of the test carried out after the improvement of the correction circuit 113. According to the graphs, as a result of the improvement, the rapid increase in the number of error occurrences at a specific temperature (22 degrees (Centigrade)) was resolved and the distributions of the number of error occurrences were made similar at all tested temperatures.

As described thus far, the NAND memory 100 as the semiconductor integrated circuit of the embodiment includes: the temperature sensor circuit 200 configured to generate the voltage VTAP corresponding to the temperature; the ADC 201 configured to convert the voltage VTAP to a digital value; the external input terminal 260 to which a digital value is input from the outside; the selector 250 configured to select either the digital value (TEMPCODE) output from the ADC 201 or the digital value (TEMPCODE') input to the external input terminal 260; and the VCGRV generation circuit 210, the VBLC generation circuit 220, the first calculation circuit 230, and the second calculation circuit 240 configured to generate the voltage VCGRV and the voltage VBLC based on the digital value selected by the selector 250.

Accordingly, the NAND memory 100 is configured such that TEMPCODE' simulating TEMPCODE can be input and is configured to correct various internal voltages (VCGRV and VBLC) according to TEMPCODE'. Therefore, it is not necessarily required to wait until TEMPCODE stabilizes at each set temperature at the time of test of the NAND memory 100; accordingly, the time required for the test is preferably shortened.

In addition, the first calculation circuit 230 and the second calculation circuit 240 perform digital calculations on the basis of TEMPCODE or TEMPCODE'. Then, the VCGRV generation circuit 210 and the VBLC generation circuit 220 generate the voltage VCGRV and the voltage VBLC on the basis of the results of the digital calculations.

Therefore, it becomes easier to quickly determine, by the above-described test, whether the increment width of the voltage VCGRV or the voltage VBLC due to the bit width of the calculation result of the digital calculations is appropriate.

In the description of the above embodiment, the correction circuit 113 generates various internal voltages required for accessing the memory cell MC.

Specifically, for example, the correction circuit 113 generates the voltage VCGRV corrected according to the temperature. The row decoder 110 applies the voltage VCGRV to the gate of the memory cell MCsel.

Therefore, whether the voltage VCGRV is appropriately corrected with respect to temperature can be quickly determined by the above-described test.

In addition, the correction circuit 113 generates the voltage VBLC corrected according to the temperature. The sense amplifier circuit SA applies the voltage VBLC to the gate of the transistor M2 to clamp the voltage of the bit line BLsel to a predetermined value.

Therefore, whether the voltage VBLC is appropriately corrected with respect to temperature can be quickly determined by the above-described test.

Furthermore, the correction circuit 113 includes the first calculation circuit 230 that performs digital calculations on the digital value selected by the selector 250, and the VCGRV generation circuit 210 serving as an analog circuit that generates the voltage VCGRV on the basis of the digital value obtained by the first calculation circuit 230. The correction circuit 113 also includes the second calculation circuit 240 that performs digital calculations on the digital value selected by the selector 250, and the VBLC generation circuit 220 serving as an analog circuit that generates the voltage VBLC on the basis of the digital value obtained by the second calculation circuit 240. Additionally, the row decoder 110 and the sense amplifier circuit SA cooperatively apply the voltage VBLC to the gate of the transistor M2 to clamp the voltage of the bit line BLsel to a predetermined value and also apply the voltage VCGRV to the gate of the memory cell MCsel.

Therefore, it is capable of quickly determining, by the above-described test, whether the combination of the increment width of the voltage VCGRV and the increment width of the voltage VBLC due to the bit width of the calculation results of the digital calculations is appropriate.

In addition, the test method of the embodiment includes a step of setting the selector 250 such that the selector 250 selects an input from the external input terminal 260 (S101), a step of inputting TEMPCPDE' to the external input terminal 260 and verifying the operation of the NAND memory 100 as the semiconductor integrated circuit (S104 to S106), and a step of varying TEMPCPDE' and verifying the operation of the NAND memory 100 again (S107, S104 to S106).

When TEMPCODE is used for the test, it is usually required to suspend subsequent processing until the value of TEMPCODE stabilizes at each set temperature. On the other hand, in the embodiment, since various internal voltages can be generated according to TEMPCODE' correlated to TEMPCODE, the time required for the test is preferably shortened.

Each loop from S103 to S108 further includes, as processing of verifying the operation of the NAND memory 100 as the semiconductor integrated circuit, a step of writing data to the NAND memory and reading out the written data (S105), and a step of counting the number of error bits included in the readout data (S106).

Therefore, it becomes easier to quickly test whether the number of error bits is uniformly reduced for every temperature.

Note that the above description has explained a case where the technique of the embodiment is applied to the NAND memory. The technique of the embodiment can be applied to an arbitrary semiconductor integrated circuit having a correction circuit that generates a first voltage corresponding to the temperature, converts the generated voltage into a digital value, and generates a second voltage according to the digital value. For example, the technique of the embodiment can be applied to a CPU. Additionally, the technique of the embodiment can also be applied to a memory of a type other than the NAND memory, such as a NOR type flash memory, a magnetoresistive random access memory (MRAM), a resistive random access memory (ReRAM), a phase change random access memory (PCM), a dynamic random access memory (DRAM), or a static random access memory (SRAM).

Furthermore, in the above description, the voltage VCGRV and the voltage VBLC are listed as the internal voltages to be corrected with respect to temperature. The internal voltage to be corrected with respect to temperature is not limited to these voltages. For example, the correction circuit 113 may be configured to correct the voltage of the source line CELSRC with respect to temperature.

In addition, in the test method described above, as an example of the processing of verifying the operation of the NAND memory 100 as the semiconductor integrated circuit, the number of error bits is counted. The processing of verifying the operation of the NAND memory 100 as the semiconductor integrated circuit is not limited to this method.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a first circuit configured to generate a first voltage corresponding to a temperature;
   an analog-to-digital converter configured to convert the first voltage into a first digital value;
   an external input terminal to which a second digital value is input from outside;
   a selector configured to select either the first digital value or the second digital value; and
   a second circuit configured to generate a second voltage based on a third digital value being a digital value selected by the selector.

2. The semiconductor integrated circuit according to claim 1, wherein the second circuit includes
   a third circuit configured to perform a digital calculation on the third digital value, and
   a fourth circuit being an analog circuit configured to generate the second voltage based on a fourth digital value obtained by the digital calculation.

3. The semiconductor integrated circuit according to claim 1, further comprising a first transistor being a memory cell whose threshold voltage is controlled to have a state corresponding to data,
   wherein the second voltage is a voltage used for accessing the first transistor.

4. The semiconductor integrated circuit according to claim 3, further comprising a third circuit configured to apply the second voltage to a gate of the first transistor when the state is determined.

5. The semiconductor integrated circuit according to claim 3, further comprising
   a bit line to which the first transistor is connected,
   a second transistor connected to the bit line, and
   a third circuit configured to clamp a voltage of the bit line to a predetermined value by applying the second voltage to a gate of the second transistor when the state is determined.

6. The semiconductor integrated circuit according to claim 3, wherein
   the second voltage includes a third voltage and a fourth voltage,
   the second circuit includes
      a third circuit configured to perform a first digital calculation on the third digital value,
      a fourth circuit being an analog circuit configured to generate the third voltage based on a fourth digital value obtained by the first digital calculation;
      a fifth circuit configured to perform a second digital calculation on the third digital value, and
      a sixth circuit being an analog circuit configured to generate the fourth voltage based on a fifth digital value obtained by the second digital calculation, and
   the semiconductor integrated circuit further comprises:
   a bit line to which the first transistor is connected;
   a second transistor connected to the bit line; and
   a seventh circuit configured to
      clamp a voltage of the bit line to a predetermined value by applying the fourth voltage to a gate of the second transistor when the state is determined, and
      apply the third voltage to a gate of the first transistor.

7. A test method of testing a semiconductor integrated circuit which includes a first circuit to generate a first voltage corresponding to a temperature, an analog-to-digital converter to convert the first voltage into a first digital value, an external input terminal to which a second digital value is input from outside, a selector to select either the first digital value or the second digital value, and a second circuit to generate a second voltage based on a third digital value being a digital value selected by the selector, the test method comprising:
   performing a first process of setting the selector to select the second digital value;
   performing a second process of inputting the second digital value and verifying operation of the semiconductor integrated circuit; and
   performing a third process of varying the second digital value after the second process and verifying again operation of the semiconductor integrated circuit.

8. The test method according to claim 7, wherein
   the semiconductor integrated circuit is a semiconductor storage device that includes a memory cell transistor whose threshold voltage is controlled to have a state corresponding to data,
   the second voltage is a determination voltage applied to a gate of the memory cell transistor to determine the state when readout processing is performed, and
   each of the second and third processes includes
      writing data to the semiconductor storage device and reading out the data from the semiconductor storage device, and
      counting an error included in the readout data.

9. The test method according to claim 7, wherein
   the semiconductor integrated circuit is a semiconductor storage device including a memory cell transistor whose threshold voltage is controlled to have a state corresponding to data,
   the second voltage is a voltage used for clamping a voltage of a bit line, which is connected to the memory cell transistor, to a predetermined value when readout processing is performed, and
   each of the second and third processes includes
      writing data to the semiconductor storage device and reading out the data from the semiconductor storage device, and
      counting an error included in the readout data.

10. The test method according to claim 7, wherein
    the semiconductor integrated circuit is a semiconductor storage device including a memory cell transistor whose threshold voltage is controlled to have a state corresponding to data,
    the second voltage includes a third voltage used for clamping a voltage of a bit line, which is connected to the memory cell transistor, to a predetermined value when readout processing is performed, and a fourth voltage applied to a gate of the memory cell transistor to determine the state when the readout processing is performed, and
    each of the second and third processes includes
       writing data to the semiconductor storage device and reading out the data from the semiconductor storage device, and
       counting an error included in the readout data.

* * * * *